United States Patent
Hsu et al.

(12) 
(10) Patent No.: US 6,214,668 B1
(45) Date of Patent: Apr. 10, 2001

(54) STRUCTURE OF A CHANNEL WRITE/ERASE FLASH MEMORY CELL AND MANUFACTURING METHOD AND OPERATING METHOD THEREOF

(75) Inventors: Ching-Hsiang Hsu, Hsinchu; Ching-Song Yang, Chang-Hua Hsien, both of (TW)

(73) Assignee: e-Memory Technology, Inc., Hsinchu (TW)

( * ) Notice: Subject to any disclaimer, the term of this patent is extended or adjusted under 35 U.S.C. 154(b) by 0 days.

(21) Appl. No.: 09/565,989

(22) Filed: May 4, 2000

Related U.S. Application Data

(62) Division of application No. 09/187,111, filed on Nov. 5, 1998, now Pat. No. 6,091,644.

(30) Foreign Application Priority Data

Mar. 21, 1998 (TW) ................................................ 87104241

(51) Int. Cl.[7] ..................... H01L 21/336; H01L 21/8236; H01L 21/425
(52) U.S. Cl. .......................... 438/257; 438/266; 438/276; 438/284; 438/306; 438/527
(58) Field of Search .................................... 438/257, 224, 438/228, 266, 276, 289, 298, 306, 527

(56) References Cited

U.S. PATENT DOCUMENTS

| | | |
|---|---|---|
| 5,050,125 | 9/1991 | Memedomi .......................... 365/185 |
| 5,268,318 * | 12/1993 | Harari ..................................... 437/43 |
| 5,448,517 | 9/1995 | Iwahshi . |
| 5,554,867 | 9/1996 | Ajika et al. . |
| 5,589,699 | 12/1996 | Araki . |
| 5,696,401 * | 12/1997 | Mizuno et al. ........................ 257/402 |
| 5,747,849 | 5/1998 | Kuroda et al. . |
| 6,064,099 * | 5/2000 | Yamada et al. ........................ 257/372 |

* cited by examiner

*Primary Examiner*—Richard Elms
*Assistant Examiner*—Adam Pyonin
(74) *Attorney, Agent, or Firm*—Jiawei Huang; J C Patents

(57) ABSTRACT

A channel write/erase flash memory cell structure together with its method of manufacture and mode of operation. The flash memory cell structure is formed by implanting P-type ions into a substrate to form a shallow-doped region, and then implanting N-type ions to form the drain terminal of the flash memory cell. Next, a deep-doped region that acts as a P-well is formed underneath the drain terminal. Method of manufacturing the channel write/erase memory cell and its mode of operation is also discussed.

18 Claims, 7 Drawing Sheets

(1)

(2)

(3)

STRUCTURE OF A CHANNEL WRITE/ERASE FLASH MEMORY CELL AND MANUFACTURING METHOD AND OPERATING METHOD THEREOF

CROSS-REFERENCE TO RELATED APPLICATION

This application is a divisional application of, and claims the priority benefit of, U.S. application Ser. No. 09/187,111 filed on Nov. 05, 1998, now U.S. Pat. No. 6,091,644.

BACKGROUND OF THE INVENTION

1. Field of Invention

The present invention relates to a structure of a non-volatile memory device and a manufacturing method and a operating method thereof. More particularly, the invention relates to a structure of a flash memory cell and a manufacturing method and operating method of the flash memory cell.

2. Description of Related Art

FIG. 1A is a cross-sectional view showing a conventional flash memory cell structure. As shown in FIG. 1A, a flash memory cell 100 is formed on a substrate 10. The flash memory cell 100 has a drain terminal 11 and a source terminal 12 in the substrate 10 lying between two adjacent field oxide layers 13. Between the source terminal 12 and the drain terminal 11, there is a stacked gate comprising a controlling gate 14 and a floating gate 15. A gate voltage $V_G$ applied to the controlling gate 14 is used for controlling the flash memory cell 100. The floating gate 15 is in a "floating" state without any direct connection with external circuits. Furthermore, between the substrate 10 and the source/drain terminals 11 and 12, there is a P-well region 16.

FIG. 1A also shows the state of action when the flash memory cell 100 is programmed. First, a gate voltage $V_G=-9V$ is applied to the controlling gate 14, a drain voltage $V_D=6V$ is applied to the drain terminal 11, and a well voltage Vwell=0 is applied to the P-well 16. No voltage is applied to the source terminal 12 and the substrate 10, that is, the state of source terminal 12 is floating. With these applied voltages, electrons (e⁻) will eject from the floating gate 15 to the drain terminal 11 due to the edge Fowler-Nordheim effect so that the flash memory cell is programmed. However, when a voltage is applied to the drain terminal 11, the voltage will create a depletion region 17 outside the drain terminal 11 region. Furthermore, hot holes (e⁺) will be generated leading to hot hole injection in the presence of lateral electric field. These hot holes can severely affect the normal operation of a flash memory cell.

To counteract the defects of using the above conventional technique, an improved operating mode is arranged. FIG. 1B is a cross-sectional view showing an improved drain structure for a conventional flash memory cell. The N⁻ region 18 is used to reduce the strength of lateral electric field so as to eliminate the effect of hot hole injection, which has a better reliability.

Although the improved flash memory cell will the N⁻ region 18 is able to improve the problem of hot hole injection, but with the N⁻ region 18 the drain region 11 and the source region 12 become more closer, which caused the punch through occurring easily. In some cases, normal operation of neighboring flash memory cells may be affected.

FIG. 1C is a top view showing the conventional flash memory cell structures as shown in FIGS. 1A and 1B. As shown in FIG. 1C, the active region of a conventional flash memory cell is protected and surrounded by field oxide layers 13. Drain current flows from the drain terminal 11 to the source terminal 12 via a path labeled A. The conventional path (from source terminal to drain terminal) taken by the current is rather long, and hence has a negative effect on its efficiency. Furthermore, as the level of integration continues to increase and dimensions of each flash memory cell is reduced, a source and a drain terminal are closer together that may lead to punch through effect. Hence, in this respect, the level of integration is severely limited.

In summary, a conventional flash memory cell structure has definite limit in the level of integration. Furthermore, with a short-circuiting connection between the drain terminal and the P-well, normal operation of neighboring flash memory cells may be affected. A conventional flash memory cell structure also suffers the defects of a longer drain current path, and a shorter distance between source and drain terminals when devices are miniaturized.

In light of the foregoing, there is a need to provide an improved flash memory cell structure and its method of manufacture.

SUMMARY OF THE INVENTION

Accordingly, the present invention is to provide a channel write/erase flash memory cell structure capable of preventing any interference with neighboring source regions or any effect on the normal operation of neighboring flash memory cells due to the short-circuiting connection between a drain terminal and a P-well.

In another aspect, this invention is to provide a method of forming the aforementioned channel write/erase flash memory cell structure.

In one further aspect, this invention is to provide an operating method for operating the aforementioned channel write/erase flash memory cell structure.

To achieve these and other advantages and in accordance with the purpose of the invention, as embodied and broadly described herein, the invention provides a channel write/erase flash memory cell structure. The structure is formed by implanting P-type ions into a substrate to form a shallow-doped region, and then implanting N-type ions to form the drain terminal of the flash memory cell. Next, a deep-doped region that acts as a P-well is formed underneath the drain terminal by implanting P-type ions. Each P-well corresponds to a doped drain region. Consequently, even when the P-well and the doped drain region are short-circuited together, it will not affect neighboring source terminals or interfere with the normal operation of a neighboring flash memory cell. Method of manufacturing the channel write/erase flash memory cell structure and its mode of operation is also discussed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in a constitute a part of this specification. The drawings illustrate embodiments of the invention and, together with the description, serve to explain the principles of the invention. In the drawings.

DESCRIPTION OF THE PREFERRED EMBODIMENTS

Figure 1A:
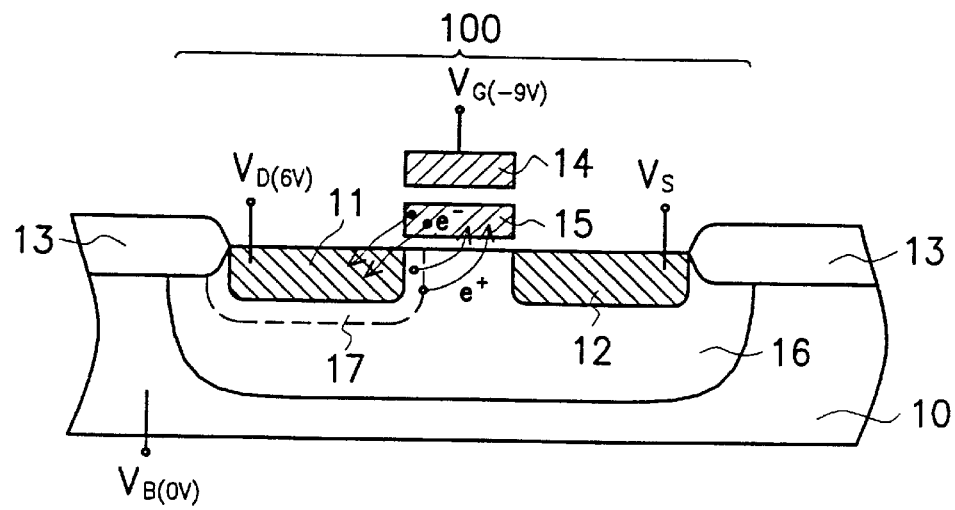
FIG. 1A is a cross-sectional view showing a conventional flash memory cell structure.
Figure 1B:
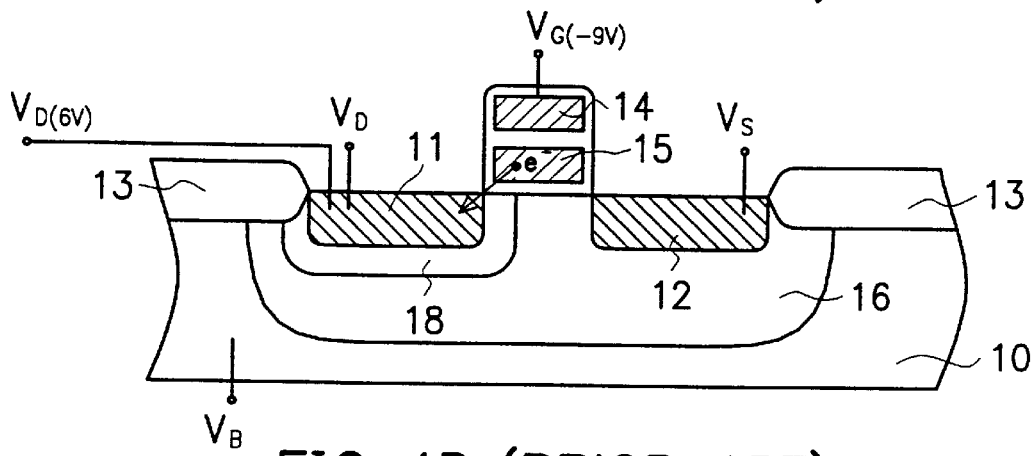
FIG. 1B is a cross-sectional view showing an improved operating mode for a conventional flash memory cell.
Figure 1C:
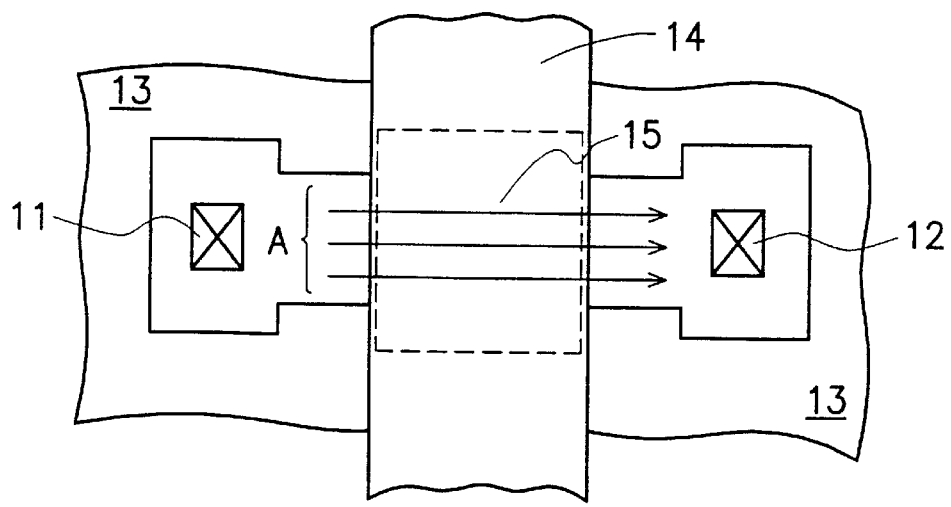
FIG. 1C is a top view showing the conventional flash memory cell structure as shown in FIGS. 1A and 1B.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
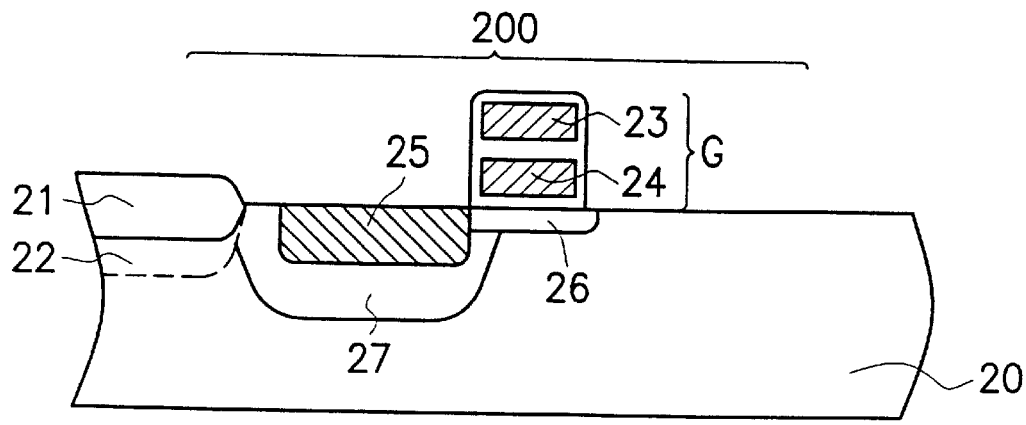
FIG. 2A is a cross-sectional view showing a flash memory cell structure according to one embodiment of this invention.

FIG. 2A is a cross-sectional view showing a flash memory cell structure 200 according to one embodiment of this invention. As shown in FIG. 2A, the flash memory cell 200 of this embodiment is built upon a substrate 20. A first field oxide layer 21 and a stacked gate G have already formed in the substrate 20, which is N-type. Underneath the first field oxide layer 21, there is a channel barrier insulating layer 22. The insulating layer 22 can be an N-doped region. The stacked gate G includes the usual components in a conventional flash memory, that is, a controlling gate 23 and a floating gate 24.

The flash memory cell 200 further comprises a first-type ion doped region 25, a shallow second-type ion doped region 26 and a deep second-type ion doped region 27. The first-type ion doped region 25 such as an N-doped region located between the first field oxide layer 21 and the stacked gate G that acts as the drain of the flash memory cell. The shallow second-type ion doped region 26 such as a P-doped region formed on one side of the N-doped region 25 and underneath the stacked gate G. The deep second-type ion doped region 27 such as a P-doped region located beneath the N-doped region 25, with one side bordering on the first field oxide layer 21 and the other side bordering on the shallow P-doped region 26. Therefore, the deep P-doped region 27, which acts as a P-well, has a depth much greater than the shallow P-doped region 26.

Figure 2B:
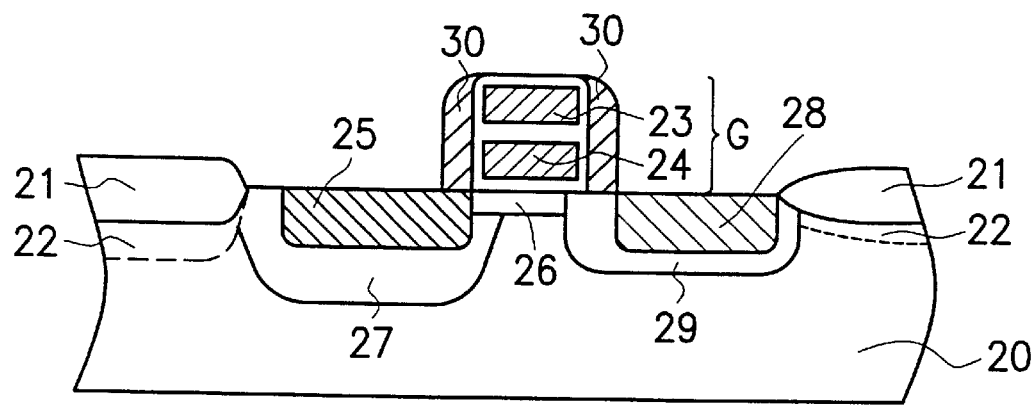
FIGS. 2B through 2D are cross-sectional views showing three types of source terminals for a flash memory cell structure according to this invention.
Figure 2C:
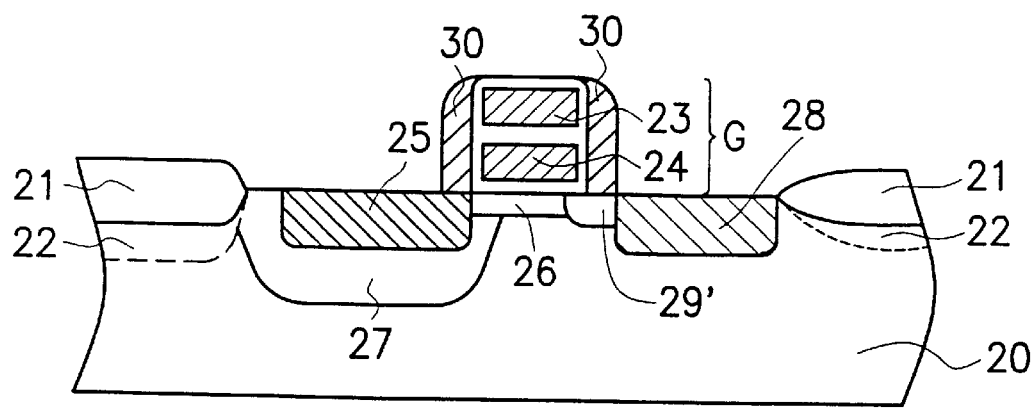
Figure 2D:
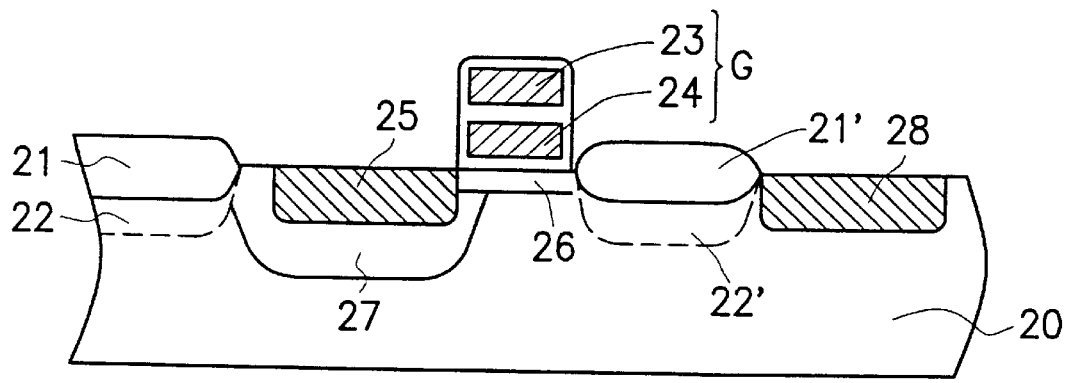

According to this invention, the source terminal of the flash memory does not have to lie on the opposite side of the drain terminal. In principle, the source terminal of the flash memory cell in this invention can be positioned almost anywhere. FIGS. 2B through 2D are used as a means to give examples of some source terminal locations, and hence should not be used to limit the scope of this invention.

The structure shown in FIG. 2B is very similar to a conventional flash memory structure. The doped region 28 formed adjacent to the shallow P-doped region 26 is the source terminal. Below the doped region 28, there is a doped region 29 having the same type of doped ions as the doped region 28. However, the concentration of dopants in the shallow region 29 is lower than the doped region 28.

FIG. 2C shows another flash memory cell structure very similar to the one in FIG. 2B. The main differences is in the formation of lightly doped drain (LDD) structures 29' on each side of the doped region 28 instead of a single continuous sheet of shallow region 29 underneath the doped region 28.

FIG. 2D shows yet another flash memory cell structure. In FIG. 2D, a second field oxide layer 21' and a second N-doped channel barrier insulating layer 22' are formed between the doped source terminal region 28 and the shallow P-doped region 26. Furthermore, the second N-doped channel barrier insulating layer 22' is formed underneath the second field oxide layer 21'.

Figure 2E:
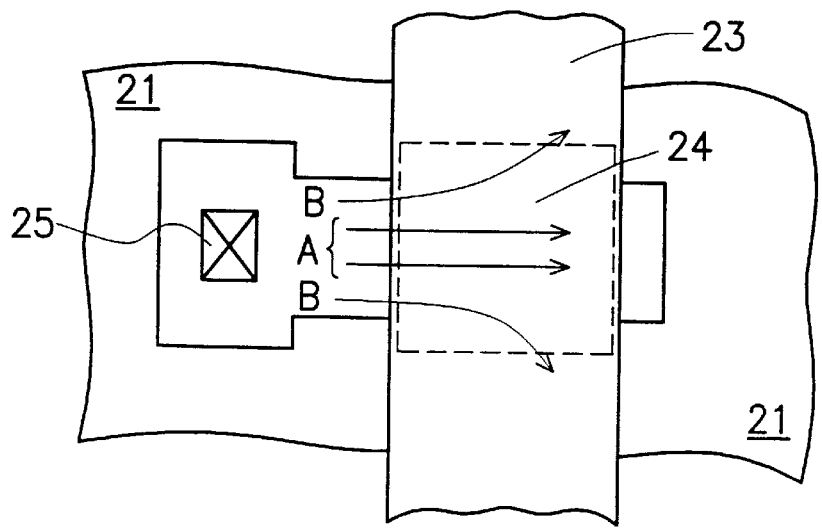
FIG. 2E is a top view showing a flash memory cell structure according to this invention.

FIG. 2E is a top view showing a flash memory cell structure according to this invention. The source terminal region of the flash memory cell is not drawn. In the FIG. 2E, a flash memory cell is surrounded by the field oxide layer 21. The flash memory cell further includes a controlling gate 23 that acts as a word line, a floating gate 24 and a drain terminal region 25. The active region is bounded by the field oxide layer 21 on three sides. Furthermore, channel barrier insulating layer (not drawn out in FIG. 2E) having the same type of dopants as the source and drain terminals is formed underneath the field oxide layer 21.

When electrons are conducted from the drain terminal 25 via the channel into the source terminal, beside the conventional path A, electrons can also flow through the alternative path B. Electrons can flow through the channel barrier insulating layer underneath the field oxide layer 21 and transfer to the source terminal. With a hot of sites for planting the source region, the drain current can have a host of alternative routes to choose.

Drain current is proportional to the width of the path and inversely proportional to the length of the path. Since path B has a shorter length than path A, path B can carry a larger drain current.

In addition, since the flash memory cell structure of this invention has few restrictions with regard to the position of source terminal, electrons can still manage to get to the source terminal via a drain current flowing in the channel barrier insulating layer underneath the field oxide layer 21. Consequently, connection between the source terminal and the drain terminal due to increased packing density in a conventional flash memory cell structure is avoided, and the level of integration can be increased.

Figure 3A:
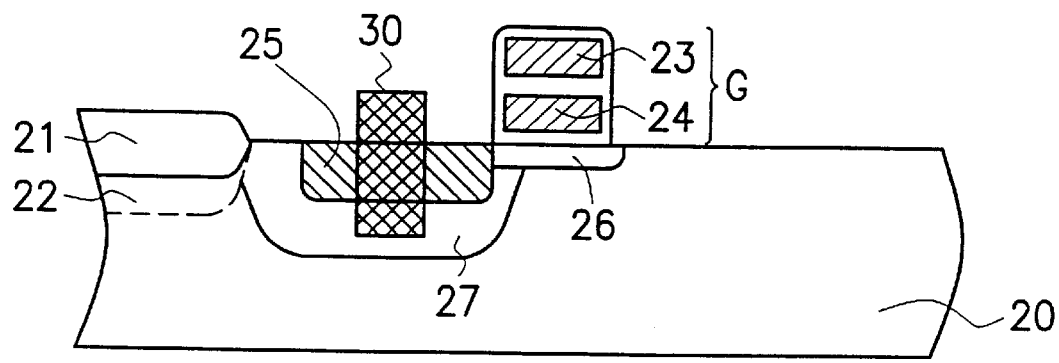
FIGS. 3A and 3B are cross-sectional views showing two types of metal contact structure associated with the flash memory cell structure of this invention.
Figure 3B:
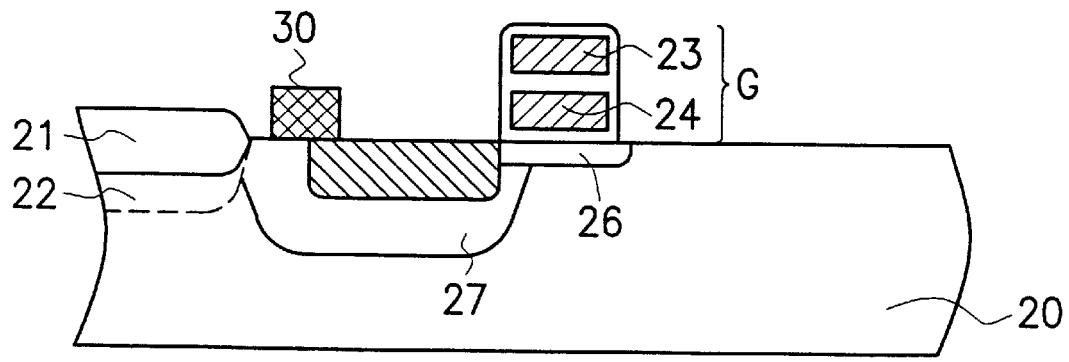

One further aspect of this invention is that the P-well 27 and drain terminal 25 can be short-circuited together using a metal contact 30. FIGS. 3A and 3B are cross-sectional views showing two types of metal contact structure associated with the flash memory cell structure of this invention. In FIG. 3A, a metal contact 30 penetrates through the doped drain region 25 and into the P-well 27 so that the two are short-circuited together. In FIG. 3B, a metal contact 30 is formed across the exposed doped drain region 25 and the exposed P-well 27, thereby short-circuiting the two together.

FIGS 4A through 4F are cross-section views showing the progression of manufacturing steps in fabricating the flash memory cell structure according to one preferred embodiment of this invention.

Figure 4A:
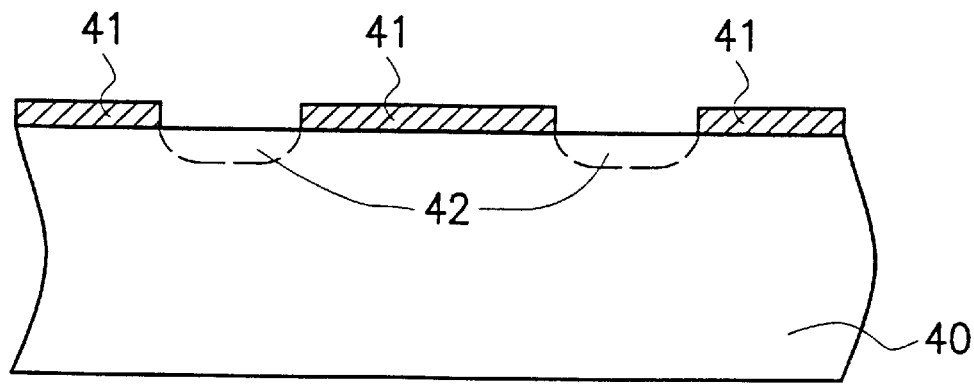
FIGS. 4A through 4F are cross-sectional views showing the progression of manufacturing steps in fabricating the flash memory cell structure according to one preferred embodiment of this invention.

First, as shown in FIG. 4A, a silicon nitride layer 41 is used to define an active region above a substrate 40. Next, a first second-type ion doped region 42 is formed in the exposed substrate 40 region. The second-type ions are N-type ions, which can be one of the fifth group elements such as phosphorus. The first second-type ion doped region 42 serves as an N-type channel barrier insulating layer.

Figure 4B:
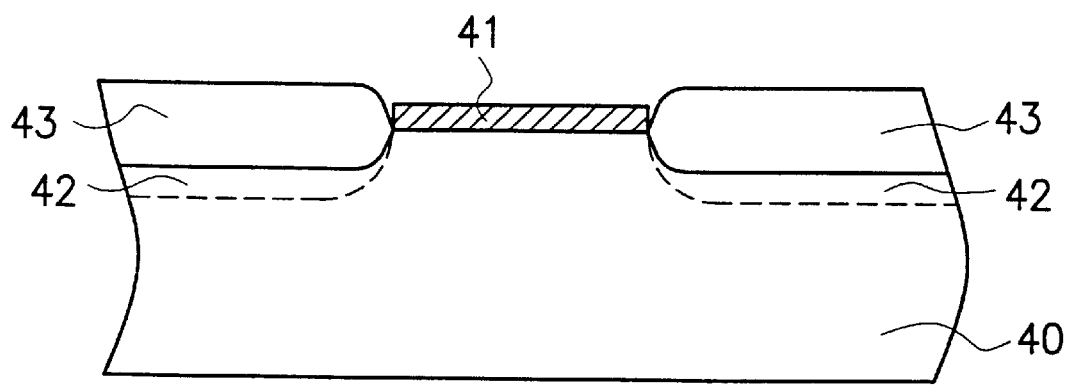

Next, as shown in FIG. 4B, a field oxide layer 43 is formed above the N-type channel barrier insulating layer 42, and then the silicon nitride layer 41 is removed.

Figure 4C:
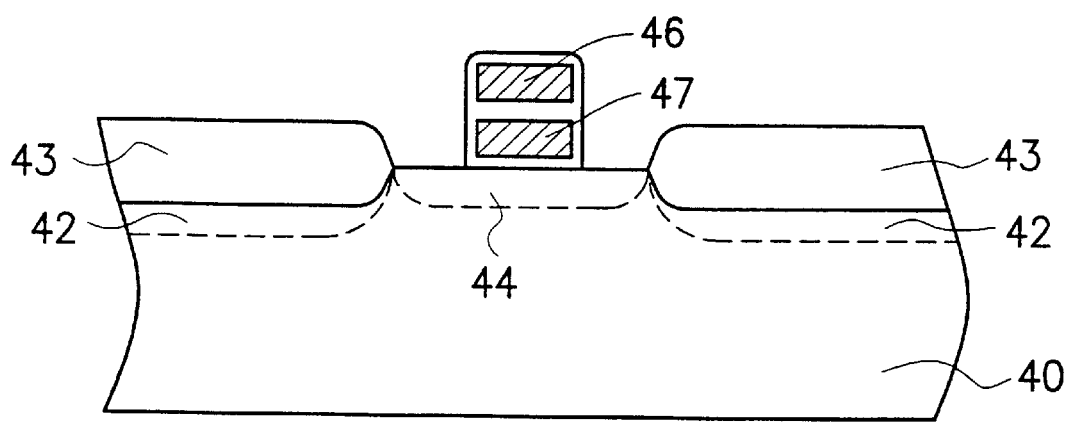

Thereafter, as shown in FIG. 4C, a shallow first-type ion doped region 44 is formed within the active region between the field oxide layer 43. The first-type ions are P-type ions, which can be one of the third group elements such as boron. Then, a first polysilicon is deposited on the P-type doped region 44, and etched to form the floating gate 47. Subsequently, an ONO film is deposited on the floating gate 47 and etched. Next, a second polysilicon is deposited on the ONO film and then etched to form the controlling gate. Finally, a stacked gate is formed.

Figure 4D:
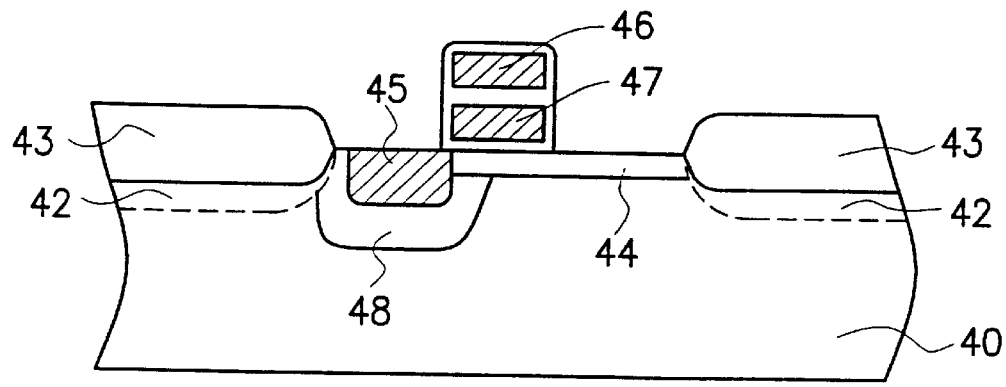

Subsequently, as shown in FIG. 4D, a deep P-type ion doped region 48 is doped, and then a second second-type ion doped region 45 is doped inside the deep P-type ion doped region 48. In other words, a second N-type ion doped region 45 is formed. Furthermore, the depth of implant for the deep P-type ion doped region 48 is much greater than the shallow P-type ion doped region 44 described in above. The second N-type ion doped region 45 serves as the drain region of a flash memory cell.

Figure 4E:
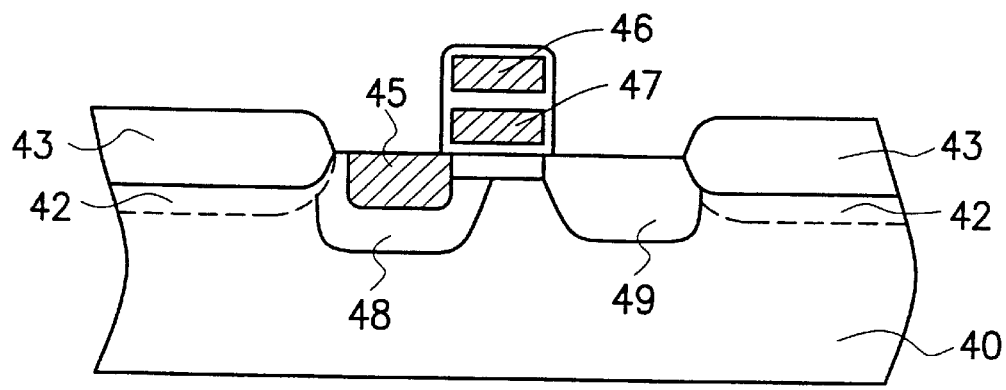
Figure 4F:
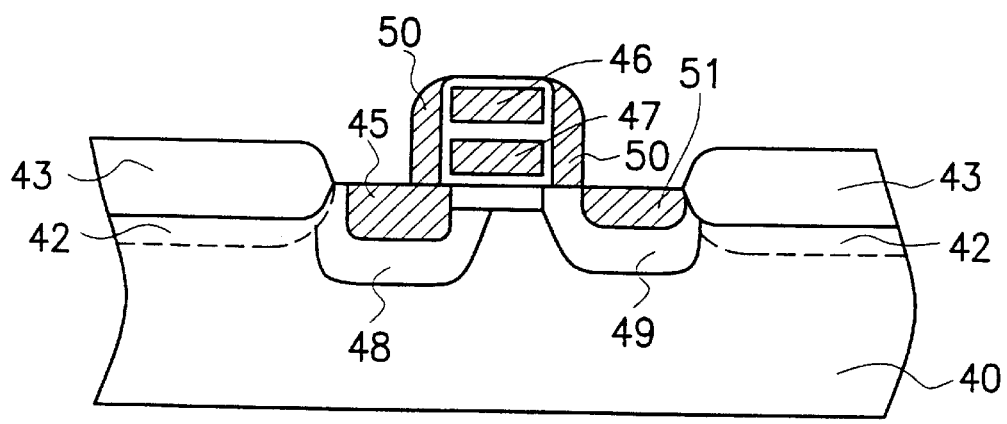

Next, as shown in FIG. 4E, a N⁻type region 49 is doped. Finally, as shown in FIG. 4F, a spacer side wall 50 is formed on the side of the stacked gate 46/47. Then, a N type doped region 51 is formed and serves as the source region of a flash memory cell.

In addition, the P-well 48 and the drain region 45 can be short-circuited together by forming a metal contact. Two types of possible connections are already described in aforementioned paragraphs and illustrated in FIGS. 3A and 3B.

Modes of operation of the flash memory cell structure can be explained with reference to FIG. 5, where FIG. 5 includes three circuit diagrams.

Figure 5:
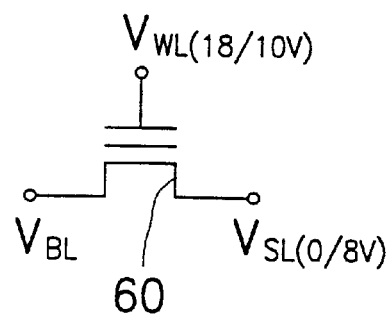
FIG. 5 includes three circuit diagrams showing modes of operation of the flash memory cell structure according to one preferred embodiment of this invention.
Figure 5:
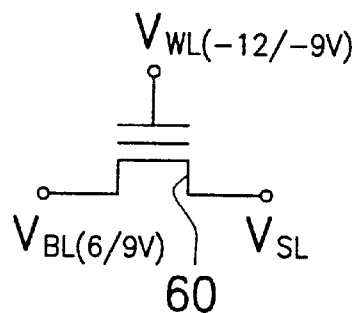
Figure 5:
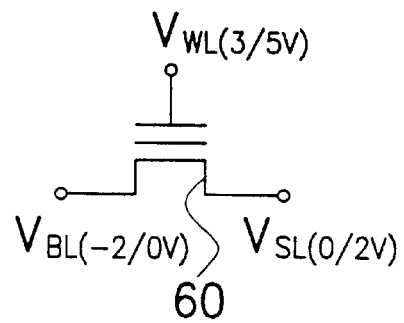

As shown in FIG. 5, a word line voltage $V_{WL}$, a source line voltage $V_{SL}$ and a bit line voltage $V_{BL}$ are applied to the control gate, the source terminal and the drain terminal of a flash memory cell 50 respectively, wherein the P-well of the flash memory cell and the bit line voltage $V_{BL}$ are short-circuited together.

FIG. 5A(1) shows the applied voltages necessary for erasing the memory stored in a flash memory cell 60. A high voltage is applied to the word line, for example, $V_{WL}$=18 to 10V, and a voltage lower than the word line voltage is applied to the source terminal, for example, $V_{SL}$=0 to −8V. Voltage of the bit line remains in a floating state. With such configuration, electrons are injected into the floating gate of the flash memory cell 60, thereby achieving the necessary data-erase operation.

FIG. 5A (2) shows the applied voltages necessary for programming data into a flash memory cell 60. A low voltage is applied to the word line, for example, about $V_{WL}$=−12V to −9V, and a voltage higher than word line voltage is applied to the bit line, for example, about $V_{BL}$=6V to 9V. Voltage of the source terminal $V_{SL}$ remains in a floating state. With such configuration, trapped floating gate electrons are ejected away through the channel, thereby achieving the necessary programming operation.

FIG. 5A (3) shows the applied voltage necessary for reading data from a flash memory cell 60. A voltage is applied to the word line, for example, $V_{WL}$=3 to 5V, and a voltage lower than the word line voltage is applied to the source terminal, for example, $V_{SL}$=0 to 2V. A voltage lower than the source terminal is applied to the bit line, for example, $V_{BL}$=0 to −2V. With such configuration, stored data can be read from the flash memory cell 60.

Therefore, unlike the conventional structure where the wells are distributed all over the substrate, a well is attached to each drain terminal in this invention. Hence, although the drain terminal and its corresponding well are short-circuited together, neighboring source terminals or the operation of neighboring flash memory cells are unaffected.

Another aspect of this invention is that each flash memory cell has its independent source terminal region. Consequently, the source terminal region of a flash memory cell is not restricted to a position on the opposite side of the drain terminal. In fact, the source terminal region can be positioned in any desirable locations.

One further aspect of this invention is that, with the source terminal region not necessarily have to be on the opposite side of the drain terminal, the problem of punch through between the source terminal and the drain terminal when the packing density of devices in increased can be prevented. Hence, the ultimate level of integration can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a channel write/erase flash memory cell, comprising the steps of:

providing a substrate;

forming a shallow first-type ion doped region in the substrate;

forming a second-type ion doped region in the substrate on one side of the shallow first-type ion doped region, wherein the second-type ion doped region serves as the drain terminal of the flash memory cell; and forming a deep first-type ion doped region underneath the second-type ion doped region, wherein the deep first-type ion doped region serves a first-type well, and that the deep first-type ion doped region has a depth greater than the shallow first-type ion doped region.

2. The method of claim 1, wherein the step of forming the channel write/erase flash memory cell further includes forming a field oxide layer and a channel barrier insulating layer on one side of the second-type ion doped region, with the channel barrier insulating layer located underneath the field oxide layer.

3. The method of claim 1, wherein the step of forming the channel write/erase flash memory cell further includes forming the controlling gate and the floating gate of a flash memory cell on the shallow first-type ion doped region.

4. The method of claim 1, wherein the step of forming the channel write/erase flash memory cell further includes forming a metal contact to short-circuit the second-type ion doped region and the first-type well together.

5. The method of claim 1, further comprising a step of short-circuiting the second-type ion doped region and the first-type well together, includes forming a metal contact that penetrates through the junction between the second-type ion doped region and the first-type well.

6. The method of claim 1, further comprising a step of short-circuiting the second-type ion doped region and the first-type well together, includes forming a metal contact across the exposed surface of the second-type ion doped region and the exposed surface of the first-type well.

7. The method of claim 1, wherein the step of forming the shallow and deep first-type ion doped regions includes implanting P-type dopants, and the step of forming the second-type ion doped region includes implanting N-type dopants.

8. The method of claim 7, wherein the step of implanting P-type dopants includes implanting boron or other group three elements.

9. The method of claim 7, wherein the step of implanting N-type dopants includes implanting phosphorus or other group five elements.

10. A method of manufacturing a channel write/erase flash memory cell, comprising the steps of:
providing a substrate;
forming an active region in the substrate;
forming a first second-type ion doped region in the substrate;
forming a field oxide layer above the first second-type ion doped region;
forming a shallow first-type ion doped region between the field oxide layer;
forming a second second-type ion doped region on one side of the shallow first-type ion doped region, wherein the second second-type ion doped region serves as the drain of the flash memory cell; and
forming a deep first-type ion doped region underneath the second second-type ion doped region, wherein the deep first-type ion doped region serves as the first-type well of the flash memory cell.

11. The method of claim 10, wherein the step of forming the active region in the substrate includes depositing a silicon nitride layer, and then removing the silicon nitride layer before the shallow first-type ion doped region is formed.

12. The method of claim 10, wherein the step of forming the channel write/erase flash memory cell further includes forming a metal contact to short-circuit the second second-type ion doped region and the first-type well together.

13. The method of claim 12, wherein the step of short-circuiting the second second-type ion doped region and the first-type well together includes forming a metal contact that penetrates through the junction between the second second-type ion doped region and the first-type well.

14. The method of claim 12, wherein the step of short-circuiting the second second-type ion doped region and the first-type well together includes forming a metal contact across the exposed surface of the second second-type ion doped region and the exposed surface of the first-type well.

15. The method of claim 10, wherein the deep first-type ion doped region has a depth far greater than the depth of the shallow first-type ion doped region.

16. The method of claim 10, wherein the step of forming the shallow and deep first-type ion doped regions includes implanting P-type dopants, and the step of forming the first and the second second-type ion doped regions includes implanting N-type dopants.

17. The method of claim 16, wherein the step of implanting P-type dopants includes implanting boron or other group three elements.

18. The method of claim 16, wherein the step of implanting N-type dopants includes implanting phosphorus or other group five elements.

* * * * *